(12) United States Patent
Xiao et al.

(10) Patent No.: US 9,079,216 B2
(45) Date of Patent: Jul. 14, 2015

(54) METHODS OF PATTERNING WITH PROTECTIVE LAYERS

(71) Applicant: SEAGATE TECHNOLOGY LLC, Cupertino, CA (US)

(72) Inventors: Shuaigang Xiao, Fremont, CA (US); XiaoMin Yang, Livermore, CA (US); Yautzong Hsu, Fremont, CA (US); HongYing Wang, Fremont, CA (US); Kim Lee, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/798,087

(22) Filed: Mar. 13, 2013

(65) Prior Publication Data

US 2013/0186856 A1    Jul. 25, 2013

Related U.S. Application Data

(63) Continuation-in-part of application No. 13/018,416, filed on Jan. 31, 2011.

(60) Provisional application No. 61/745,529, filed on Dec. 21, 2012.

(51) Int. Cl.

| | | |
|---|---|---|
| B44C 1/22 | (2006.01) | |
| C23F 1/00 | (2006.01) | |
| G11B 5/65 | (2006.01) | |
| B05D 3/10 | (2006.01) | |
| B05D 3/00 | (2006.01) | |
| B05C 21/00 | (2006.01) | |
| G03F 7/20 | (2006.01) | |
| G11B 5/74 | (2006.01) | |
| G11B 5/855 | (2006.01) | |
| H01L 21/02 | (2006.01) | |
| H01L 21/3065 | (2006.01) | |

(52) U.S. Cl.
CPC ............. *B05D 3/107* (2013.01); *B05C 21/005* (2013.01); *B05D 3/007* (2013.01); *G03F 7/20* (2013.01); *G11B 5/746* (2013.01); *G11B 5/855* (2013.01); *H01L 21/02112* (2013.01); *H01L 21/3065* (2013.01); *Y10T 428/24802* (2015.01)

(58) Field of Classification Search
CPC ........ H01L 43/12; H01L 21/00; H01L 21/302
See application file for complete search history.

(56) References Cited

U.S. PATENT DOCUMENTS

| | | | | |
|---|---|---|---|---|
| 5,304,461 | A  * | 4/1994 | Inoue et al. | 430/323 |
| 8,623,223 | B2 | 1/2014 | Dobisz et al. | |
| 2009/0039560 | A1* | 2/2009 | Nishikawa et al. | 264/427 |
| 2012/0107483 | A1* | 5/2012 | Park et al. | 426/634 |
| 2012/0107583 | A1* | 5/2012 | Xiao et al. | 428/210 |
| 2013/0016444 | A1* | 1/2013 | Grobis et al. | 360/294 |

* cited by examiner

*Primary Examiner* — Duy Deo

(57) ABSTRACT

The embodiments disclose a method of fabricating servo integrated templates including depositing a protective layer on servo zone resist layer patterns, patterning integrated data zone features into a substrate, depositing a protective layer on data zones and removing the servo zone protective layer and patterning integrated servo zone features into the substrate and removing the data zone protective layer creating a substrate template used in fabricating data and servo zone integrated patterned stacks.

20 Claims, 10 Drawing Sheets

1

METHODS OF PATTERNING WITH PROTECTIVE LAYERS

CROSS-REFERENCE TO RELATED APPLICATIONS

This application is a continuation in part of and claims priority to U.S. patent application Ser. No. 13/018,416 filed on Jan. 31, 2011, and also claims the benefit of provisional application 61/745,529 filed on Dec. 21, 2012, the disclosures of all of which are hereby incorporated by reference in their entirety.

BACKGROUND

Bit patterned media (BPM) fabrication technology currently uses low cost and high throughput nano-imprint lithography (NIL) to crate sub-20 nm density patterns on a disk. The current NIL is used to fabricate BPM imprint templates at areal density of less than 1.5 Tera dots per square inch (Tdpsi).

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope.

General Overview:

It should be noted that the descriptions that follow, for example, in terms of a method of fabricating servo integrated template is described for illustrative purposes and the underlying system can apply to any number and multiple types of templates. In one embodiment, the method of fabricating servo integrated template can be configured using block copolymer (BCP) directed self-assembly (DSA). The method of fabricating servo integrated template can be configured to include BCP optical lithography and can be configured to include one-dimensional trench guide template patterns in servo zones using the present embodiments.

Figure 1:
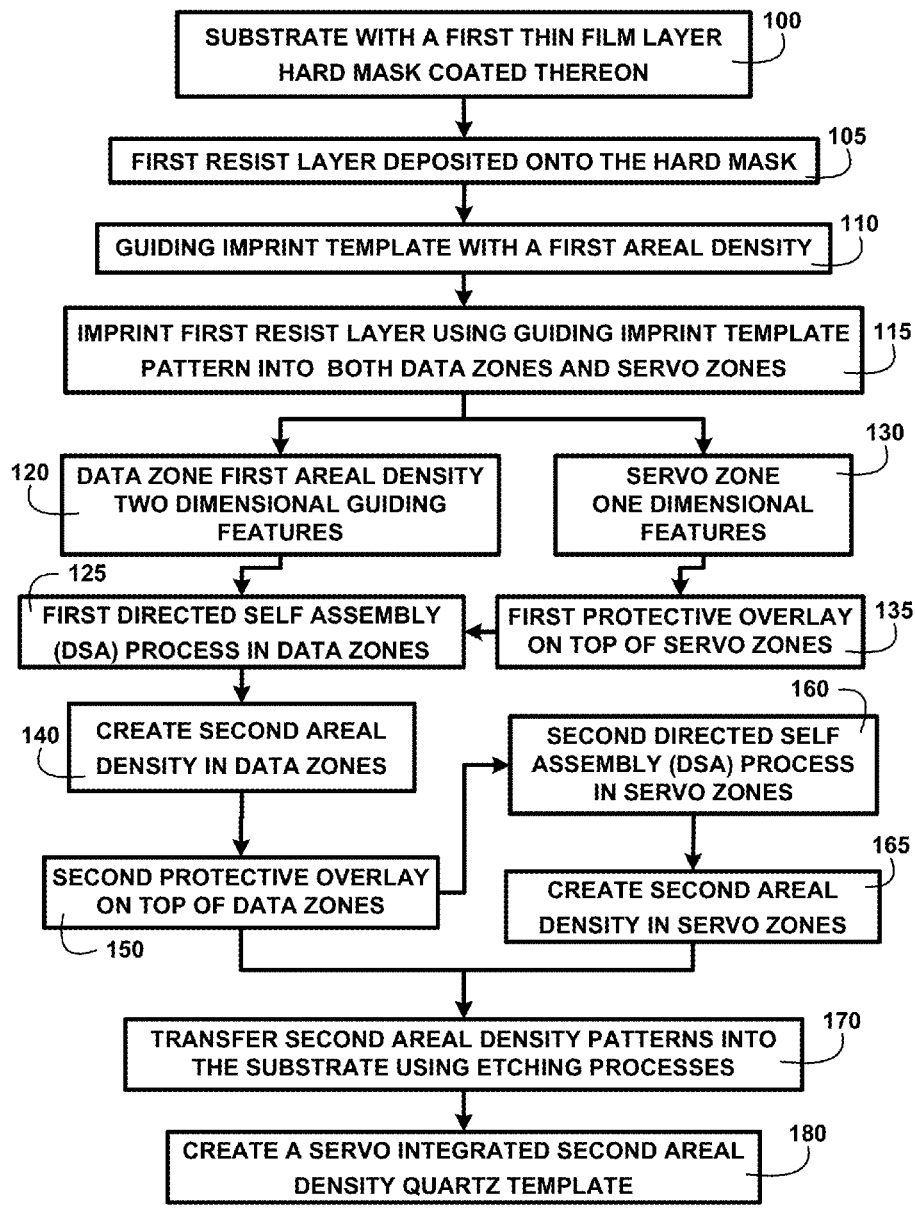
FIG. 1 shows a block diagram of an overview of method of fabricating servo integrated template of one embodiment.

The following descriptions include using features for stack patterns including bit patterned media (BPM) dots but can include other stack patterns without departing from the present embodiments. FIG. 1 shows a block diagram of an overview of method of fabricating servo integrated template of one embodiment. FIG. 1 shows a substrate with a first thin film layer hard mask coated thereon 100. The substrate includes using materials including quartz. A first resist layer deposited onto the hard mask 105. The hard mask includes using a thin film of chromium (Cr).

A process is used to imprint first resist layer using guiding imprint template pattern into both data zones and servo zones 115. The guiding imprint template includes using a two dimensional hexagonal imprinted resist dot pattern with a first areal density in data zones. The first areal density two dimensional guiding features 120 include a 375 Giga dots per square inch (Gdpsi) hexagonal pattern in data zones. The guiding imprint template includes using a one dimensional imprinted resist trench line pattern in servo zones. The servo zone one dimensional features 130 include trench patterns in servo zones of one embodiment.

Overlay processes are used to pattern both the data and servo zones. An overlay process uses two or more sets of template patterns that for example cover an entire surface and are divided into individual sections using an alignment scheme and alignment mark settings to identify the matching points where the sections were divided to enable aligning of those points to position each section accurately relative to the original undivided status position.

Overlay processes as described herein include a first protective overlay and a second protective overlay. The first protective overlay process is aligned over servo zones and a deposit of a protective layer is used to protect imprinted patterns in a servo zone resist layer. The protective layer protects the servo zone pattern during a process to pattern the unprotected data zones with a different areal density. The protective layer deposited in the first protective overlay process is then removed and the second protective overlay process is used to deposit a protective layer on the data zones. The protective layer protects the data zone pattern during a process to pattern the unprotected servo zones with a different areal density.

A first protective overlay on top of servo zones 135 protects the imprinted servo zone one dimensional features 130. A first directed self-assembly (DSA) process in data zones 125 is used to create second areal density in data zones 140. A process is used to transfer second areal density patterns into the substrate using etching processes 170 from the data zones. A process is used to deposit a second protective overlay on top of data zones 150 etched into the substrate.

A second directed self-assembly (DSA) process in servo zones 160 is used to create second areal density in servo zones 165. A process is used to transfer second areal density patterns into the substrate using etching processes 170. The transfers of the second areal density patterns of both the data zones and servo zones are used to create a servo integrated second areal density quartz template 180 used to fabricate stacks including bit patterned media (BPM) with a second areal density equal to or greater than 1.5 Tera dots per square inch (Tdpsi) of one embodiment.

DETAILED DESCRIPTION

Figure 2A:
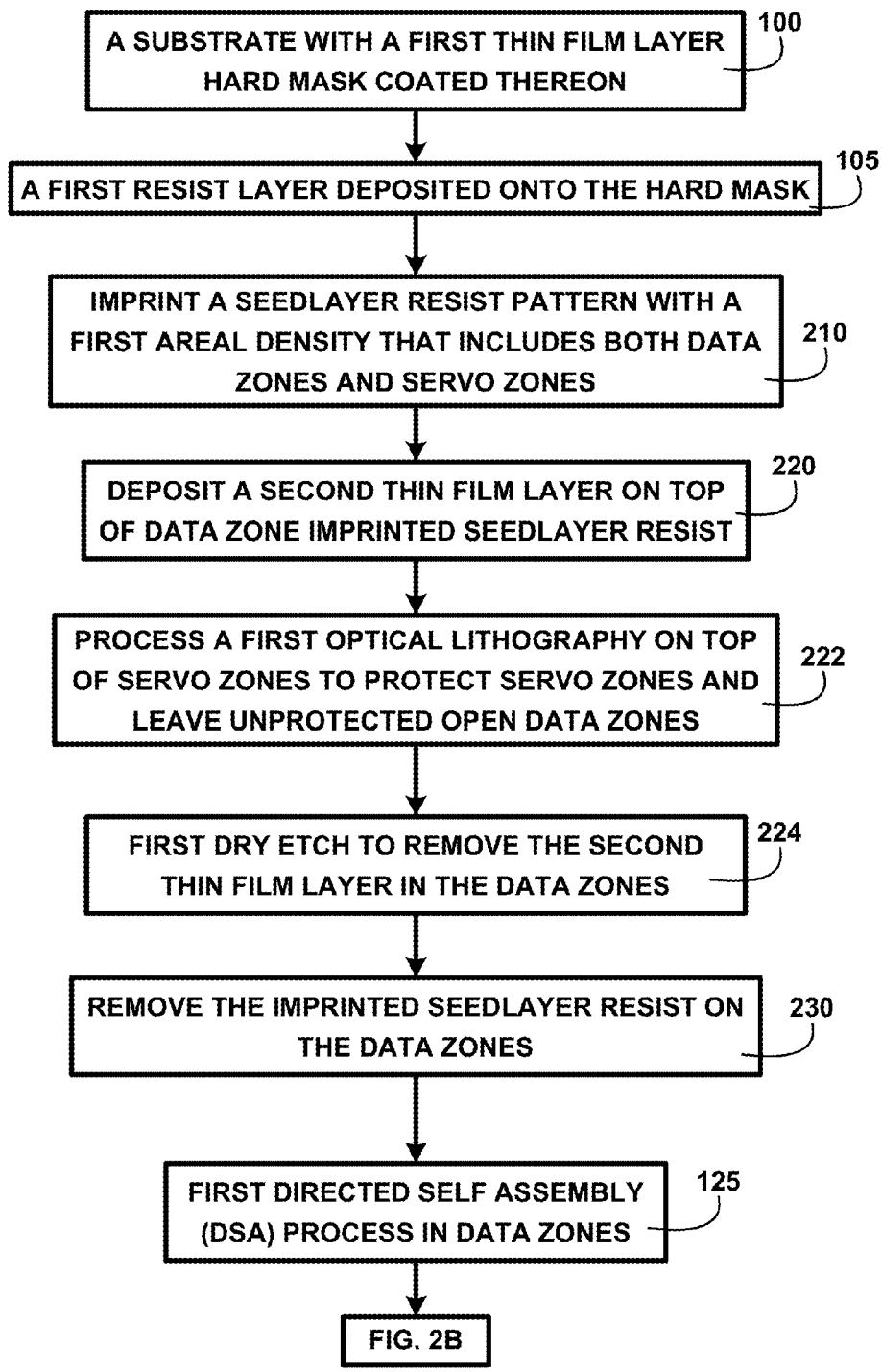
FIG. 2A shows a block diagram of an overview flow chart of method of fabricating servo integrated template of one embodiment.

Data Zones Overlay:

FIG. 2A shows a block diagram of an overview flow chart of method of fabricating servo integrated template of one embodiment. FIG. 2A shows the substrate with a first thin film layer hard mask coated thereon 100 and the first resist layer deposited onto the hard mask 105. A process is used to imprint a seedlayer resist pattern with a first areal density that includes both data zones and servo zones 210. A process is used to deposit a second thin film layer on top of data zone imprinted seedlayer resist 220.

The next step is to process a first optical lithography on top of servo zones to protect servo zones and leave unprotected open data zones 222. The first optical lithography is used to define the servo zones. A first dry etch to remove the second thin film layer in the data zones 224 and remove the imprinted seedlayer resist on the data zones 230. A first directed self-assembly (DSA) process in data zone 232 is processed. The processes continue and are described in FIG. 2B of one embodiment.

Figure 2B:
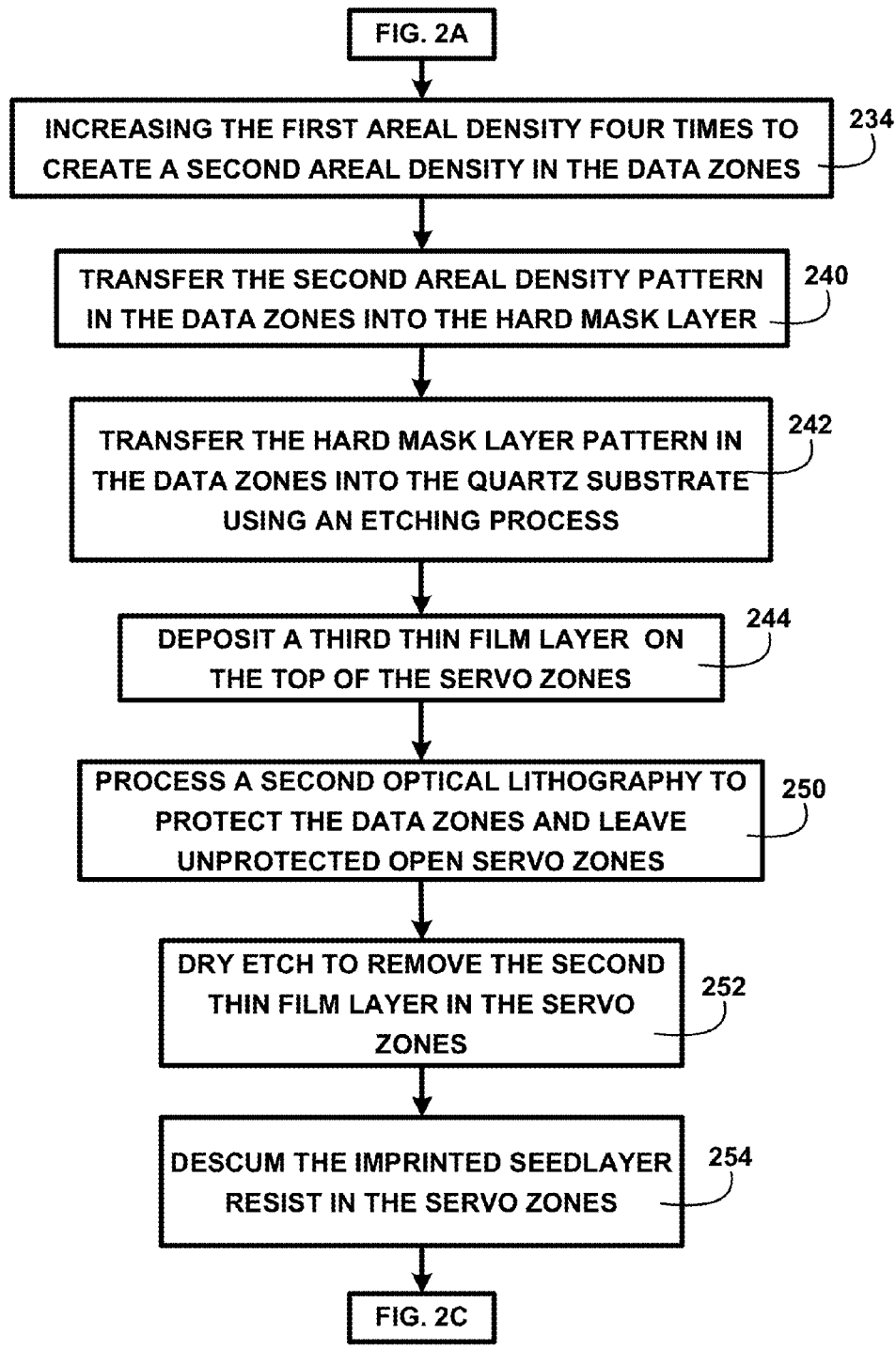
FIG. 2B shows a block diagram of an overview flow chart of servo zones overlay process of one embodiment.

Servo Zones Overlay:

FIG. 2B shows a block diagram of an overview flow chart of servo zones overlay process of one embodiment. FIG. 2B shows processes that continue from FIG. 2A. The first directed self-assembly (DSA) process in data zone 232 of FIG. 2A are used for increasing the first areal density approximately four times to create a second areal density in the data zones 234. The increase in areal density can include a first areal density of for example 375 Gdpsi and the second areal density is increased to for example 1.5 Tdpsi. In another embodiment a first areal density of for example 800 Gdpsi will produce a second areal density of 3.2 Tdpsi. A process is used to transfer the second areal density pattern in the data zones into the hard mask layer 240. The BCP is removed and a process is used to transfer the hard mask layer pattern in the data zones into the quartz substrate using an etching process 242 including of one embodiment.

A process is used to deposit a third thin film layer on the top of the servo zones 244. A process is used to process a second optical lithography to protect the data zones and leave unprotected open servo zones 250. The second optical lithography is used to define the data zones. A dry etch to remove the second thin film layer in the servo zones 252 is used then followed by a process to descum the imprinted seedlayer resist in the servo zones 254. Descriptions of continuing processes are shown in FIG. 2C of one embodiment.

Figure 2C:
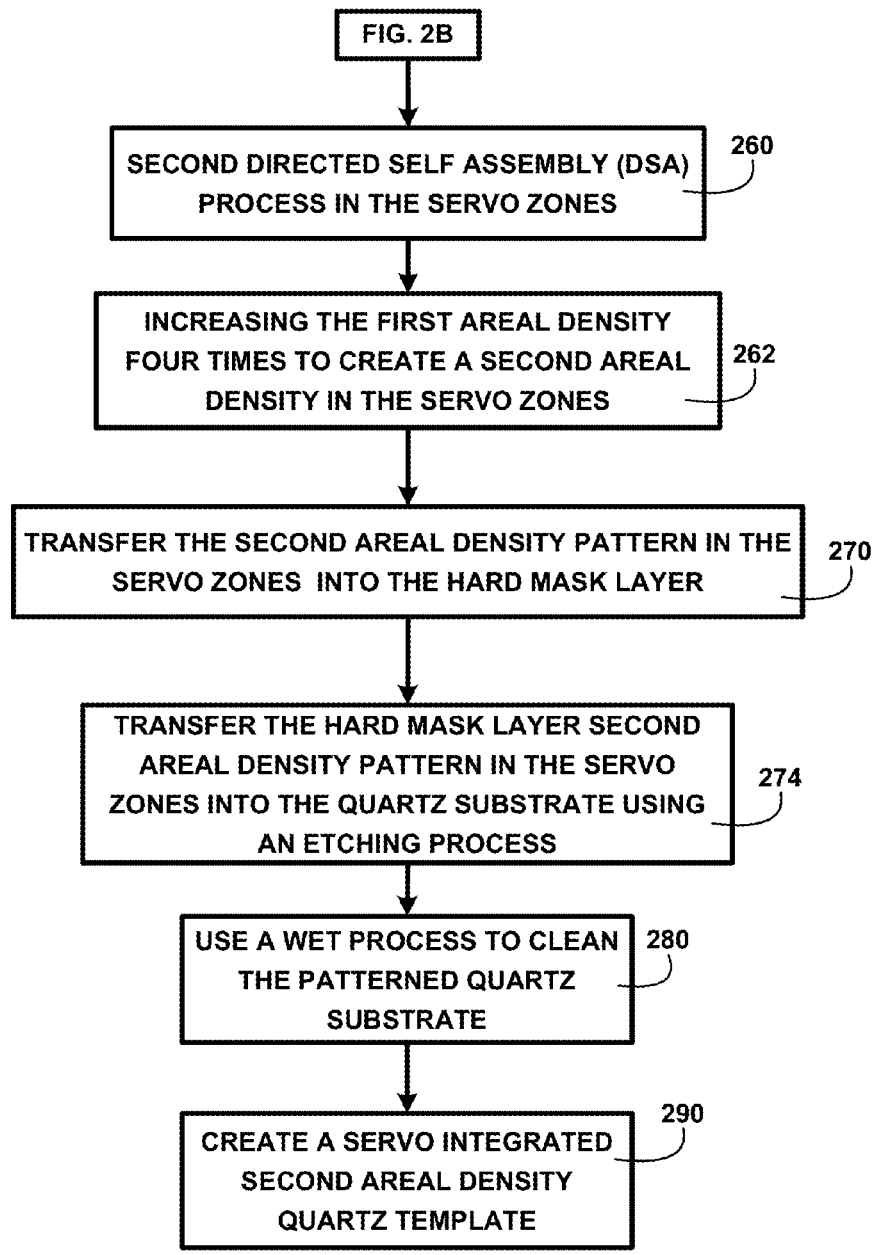
FIG. 2C shows a block diagram of an overview flow chart of a pattern transfer into a servo integrated template process of one embodiment.

Servo Integrated Quartz Template:

FIG. 2C shows a block diagram of an overview flow chart of a pattern transfer into a servo integrated template process of one embodiment. FIG. 2C shows continuing processing from FIG. 2B including a second directed self-assembly (DSA) process in the servo zones 260. The second directed self-assembly (DSA) process in the servo zones 260 is used for increasing the first areal density approximately four times to create a second areal density in the servo zones 262. A process is used to transfer the second areal density pattern in the servo zones into the hard mask layer 270. After removing the BCP material a process is used to transfer the hard mask layer second areal density pattern in the servo zones into the quartz substrate using an etching process 274 including carbon tetrafluoride (CF4) reactive ion etching (RIE). The processing continues to use a wet process to clean the patterned quartz substrate 280. The method of fabricating servo integrated template has been used to create a servo integrated second areal density quartz template 290 with both periodic features in the data zones and non-periodic features in the servo zones of one embodiment.

Figure 3A:
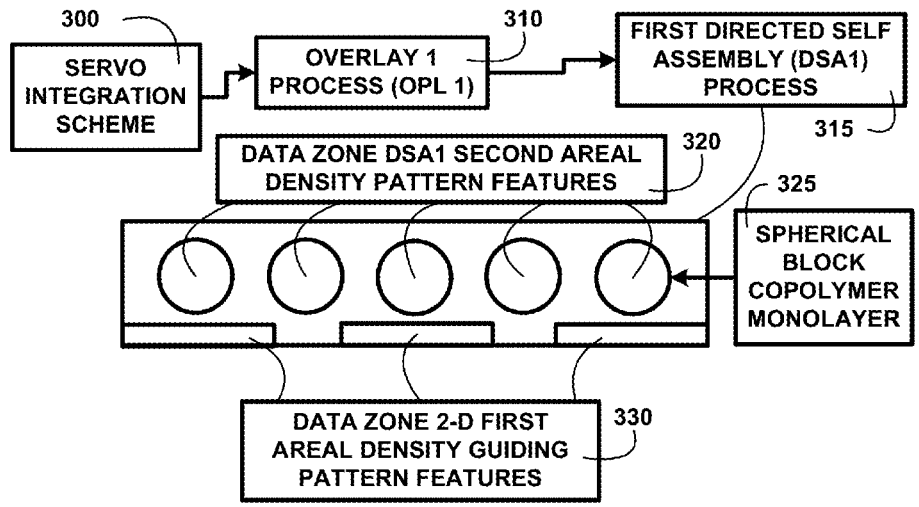
FIG. 3A shows for illustrative purposes only an example of a first overlay process of one embodiment.

Overlay 1 process (OPL 1):

FIG. 3A shows for illustrative purposes only an example of a first overlay process of one embodiment. FIG. 3A shows a servo integration scheme 300 including an overlay 1 process (OPL 1) 310 followed by a first directed self-assembly process 315. The first directed self-assembly process 315 uses data zone 2-D first areal density guiding pattern features 330 to create data zone DSA1 second areal density pattern features 320 of a spherical block copolymer monolayer 325 of one embodiment.

Figure 3B:
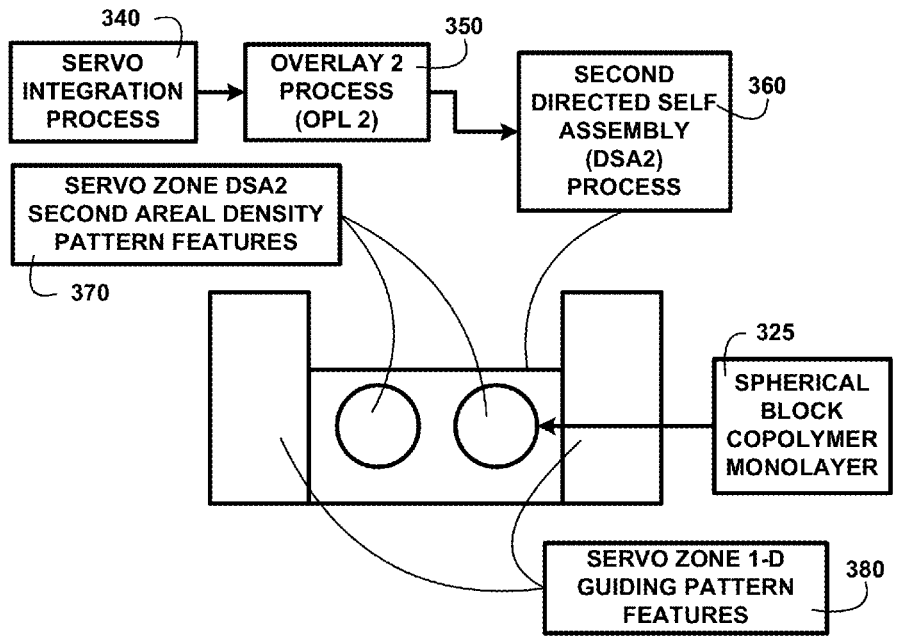
FIG. 3B shows for illustrative purposes only an example of a second overlay process of one embodiment.

Overlay 2 Process (OPL 2):

FIG. 3B shows for illustrative purposes only an example of a second overlay process of one embodiment. FIG. 3B shows a servo integration process 340 using an overlay 2 process (OPL 2) 350 and a second directed self-assembly process 360. The second directed self-assembly process 360 uses servo 1-D guiding pattern features 380 to create servo zone DSA2 second areal density pattern features 370 of a spherical block copolymer monolayer 325 of one embodiment.

Figure 4A:
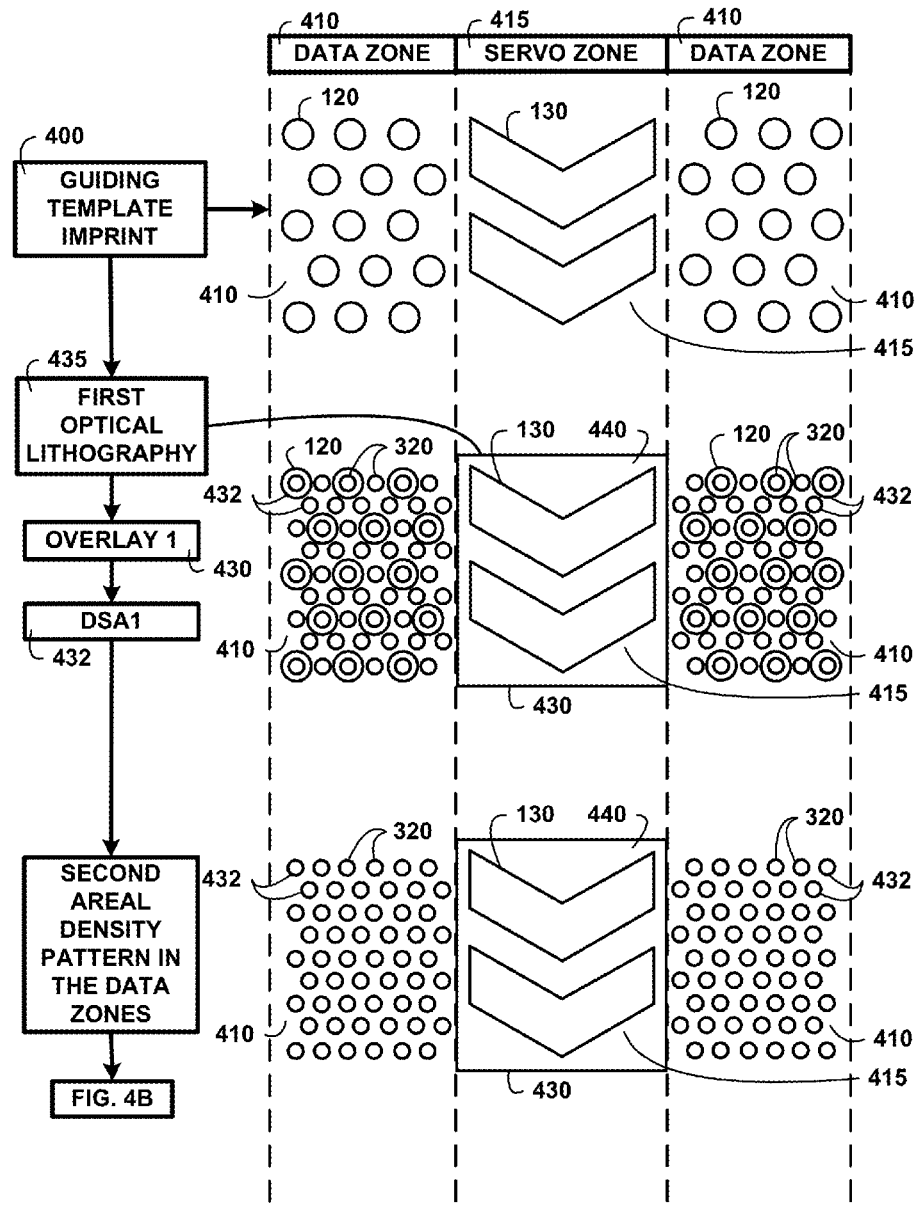
FIG. 4A shows for illustrative purposes only an example of fabricating a servo integrated template of one embodiment.

Guiding Template:

FIG. 4A shows for illustrative purposes only an example of fabricating a servo integrated template of one embodiment. FIG. 4 shows a guiding template imprint 400 that includes in a data zone 410 data zone first areal density two dimensional guiding features 120. The guiding template imprint 400 includes in the servo zone 415 servo zone one dimensional features 130 of one embodiment. The data zone first areal density two dimensional guiding features 120 includes using for example a 375 Gdpsi hexagonal pattern and an 800 Gdpsi hexagonal pattern of dots for fabricating Bit-patterned media (BPM) templates used to create BPM stacks. The servo zone one dimensional features 130 includes lines and other shapes to guide a block copolymer (BCP) directed self-assembly (DSA) used in creating an integrated servo zone of one embodiment.

Overlay 1 and DSA 1:

An overlay 1 430 and DSA1 432 use a first optical lithography 435 to protect servo zones 440. The servo zone 415 includes the servo zone one dimensional features 130. The first optical lithography 435 leaves the data zones open for other processing. In the data zone 410 a process including a block copolymer (BCP) directed self-assembly (DSA) is used to create data zone DSA1 second areal density pattern features 320 using the data zone first areal density two dimensional guiding features 120. The DSA1 process in data zone includes using for example a hexagonal imprint guiding pattern 375 Gdpsi pattern to increase the number of features by a factor of 4 to create a second areal density of 1.5 Tdpsi in the data zone. Other processes are described in FIG. 4B of one embodiment.

Figure 4B:
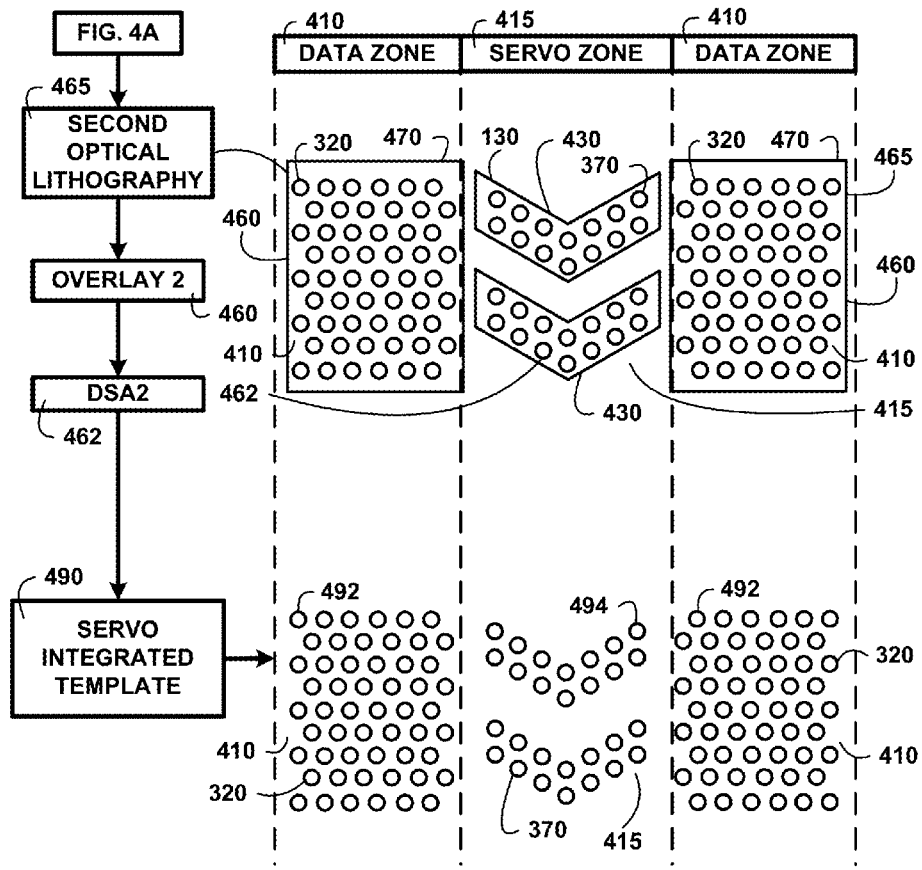
FIG. 4B shows for illustrative purposes only an example of fabricating a servo integrated template of one embodiment.

Overlay 2 and DSA 2:

FIG. 4B shows for illustrative purposes only an example of fabricating a servo integrated template of one embodiment. An overlay 2 460 and DSA2 462 use a second optical lithography 465 to protect the data zones 470 wherein the data zone DSA1 second areal density pattern features 320 have been etched into a substrate. The second optical lithography 465 to protect the data zones 470 defines the data zone 410. In the open or unprotected servo zone 415 the servo zone one dimensional features 130 are used in for example a block copolymer (BCP) directed self-assembly (DSA) to create servo zone DSA2 second areal density pattern features 370. The servo zone DSA2 second areal density pattern features 370 include for example a second areal density of 1.5 Tdpsi.

The servo zone DSA2 second areal density pattern features 370 are etched into the substrate of one embodiment.

Servo Integrated Template:

FIG. 4B additionally shows in the data zone 410 data zone DSA1 second areal density pattern features etched into substrate 492 are periodic features. In the servo zone 415 servo zone DSA2 second areal density pattern features etched into substrate 494 are non-periodic features. FIG. 4B shows an illustration of the integration of data zone 410 second areal density periodic features and servo zone 415 second areal density non-periodic features with a servo integrated template 490. The first areal density imprint includes for example using a 375 Gdpsi hexagonal pattern to create a second areal density of 1.5 Tdpsi servo integrated template 490 and for example using a first areal density 800 Gdpsi imprint to create a second areal density of 3.2 Tdpsi servo integrated template 490 of one embodiment.

Figure 5A:
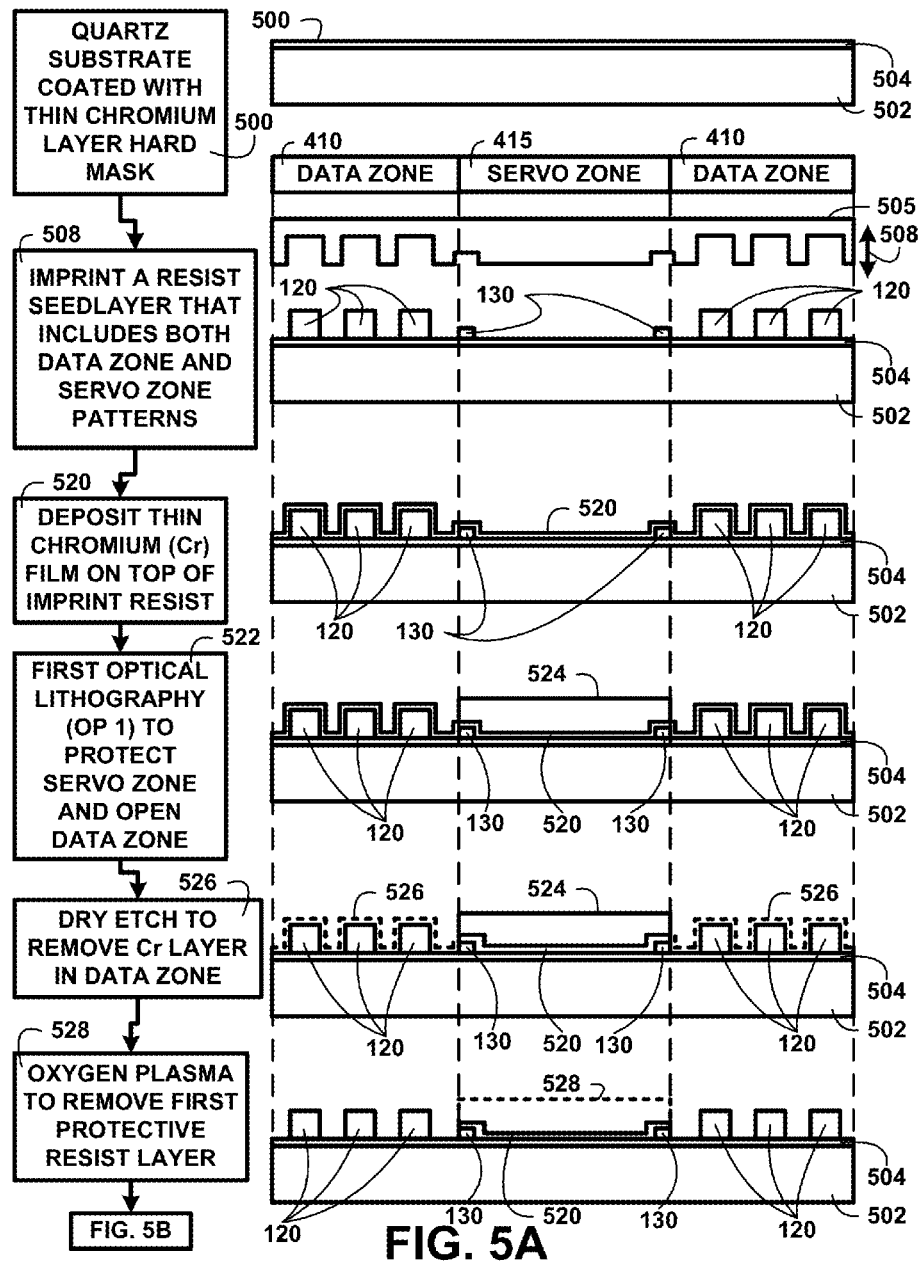
FIG. 5A shows for illustrative purposes only an example of an imprinted seedlayer with integrated data and servo zones of one embodiment.

Imprinted Seedlayer:

FIG. 5A shows for illustrative purposes only an example of an imprinted seedlayer with integrated data and servo zones of one embodiment. FIG. 5A shows a substrate that can be used in the method of fabricating servo integrated template to create a servo integrated template. The substrate includes a quartz substrate 502. The method of fabricating servo integrated template includes coating the quartz substrate 502 with a hard mask including a thin chromium layer hard mask 504. A quartz substrate coated with thin chromium layer hard mask 500 is ready for further processing of one embodiment.

The process continues to imprint a resist seedlayer that includes both data zone and servo zone patterns 508. A seedlayer guiding imprint template 505 is used to imprint first areal density two dimensional guiding features 120 in the data zone 410. The seedlayer guiding imprint template 505 imprints one dimensional features 130 in the servo zone 415. A process is used to deposit thin chromium (Cr) film on top of imprint resist 520. A first optical lithography (OP 1) to protect servo zone and open data zone 522 process is used to deposit a first protective resist layer 524 on top of the servo zone. A dry etch to remove Cr layer in data zone 526 is processed to open the data zone for further processing. A process using oxygen plasma to remove first protective resist layer 528 is in preparation for further processing. The processes that follow are described in FIG. 5B of one embodiment.

Figure 5B:
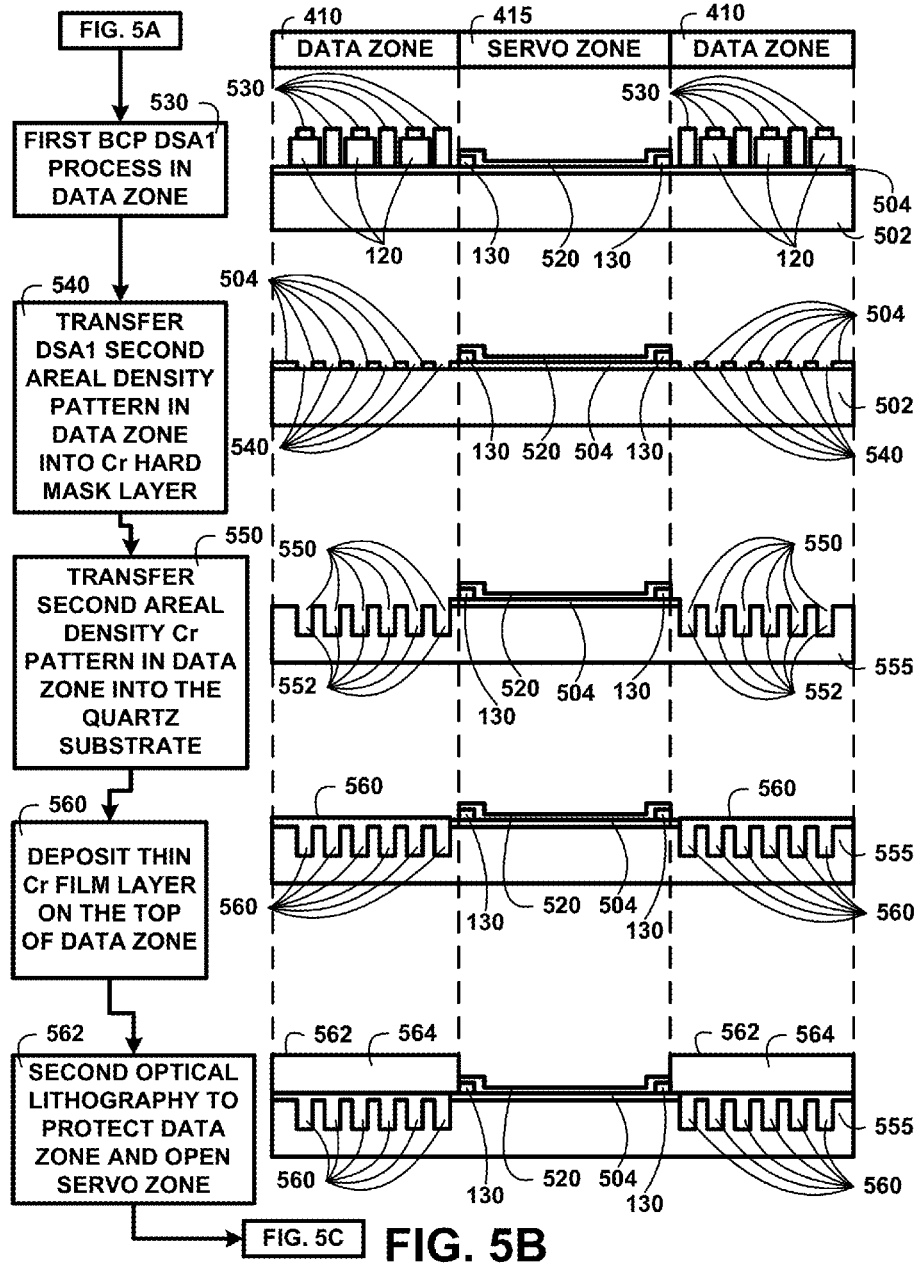
FIG. 5B shows for illustrative purposes only an example of a data zone first block copolymer directed self-assembly process of one embodiment.

First BCP DSA1:

FIG. 5B shows for illustrative purposes only an example of a data zone first block copolymer directed self-assembly process of one embodiment. FIG. 5B shows processes continuing from FIG. 5A. FIG. 5B shows a first BCP DSA1 process in data zone 530. The first BCP DSA1 process in data zone 530 creates second areal density pattern features. A process including carbon tetrafluoride (CF4) reactive ion etching (RIE) to transfer DSA1 second areal density pattern in data zone into Cr hard mask layer 540. A CF4 RIE process is used to transfer second areal density Cr patterns in data zone into the quartz substrate 550. The CF4 RIE process creates etched second areal density data zone pattern features 552 in the quartz substrate 502. A quartz substrate with etched data zone features 555 is processed including a second optical lithography to protect data zone and open servo zone 562. The second optical lithography to protect data zone and open servo zone 562 includes a second protective resist layer 564 on top of the etched data zones. Descriptions of subsequent processes are shown in FIG. 5C of one embodiment.

Figure 5C:
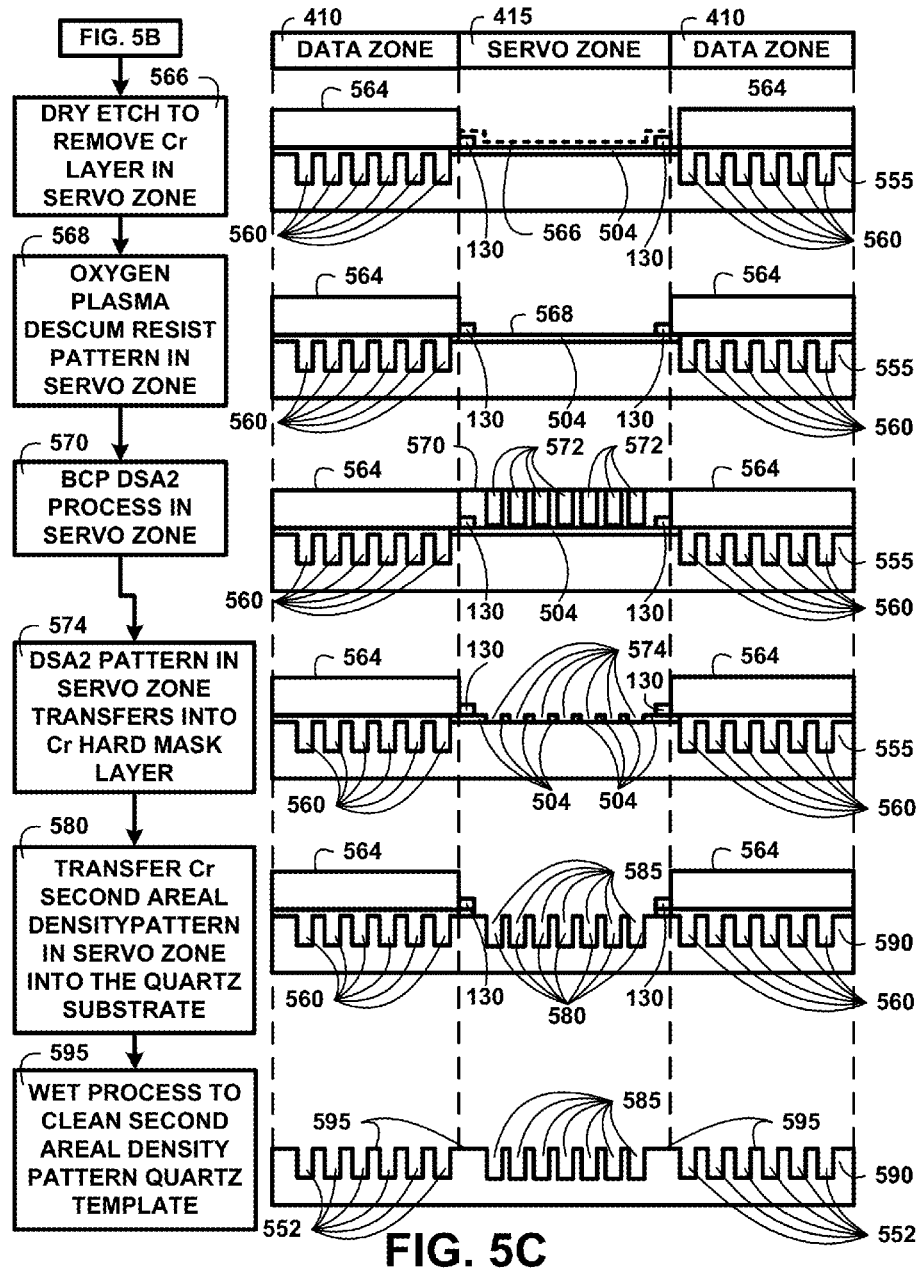
FIG. 5C shows for illustrative purposes only an example of a servo zone second block copolymer directed self-assembly process of one embodiment.

Second BCP DSA1:

FIG. 5C shows for illustrative purposes only an example of a servo zone second block copolymer directed self-assembly process of one embodiment. FIG. 5C shows a continuation of processes from FIG. 5B including a dry etch to remove Cr layer in servo zone 566. An oxygen plasma descum resist pattern in servo zone 568 is process to clean the servo zone 415. A BCP DSA2 process in servo zone 570 is used to create second areal density patterns 572. The CF4 RIE process is used to process DSA2 pattern in servo zone transfers into Cr hard mask layer 574 of one embodiment.

The CF4 RIE process is used to transfer Cr second areal density pattern in servo zone into the quartz substrate 580. The etched servo second areal density patterns 585 are non-periodic. The addition of the etched servo second areal density patterns 585 creates a second areal density servo integrated template 590. A wet process to clean second areal density pattern quartz template 595 reveals the second areal density servo integrated template 590 including the periodic etched second areal density data zone pattern features 552 and the non-periodic etched servo second areal density patterns 585 of one embodiment.

The foregoing has described the principles, embodiments and modes of operation. However, the invention should not be construed as being limited to the particular embodiments discussed. The above described embodiments should be regarded as illustrative rather than restrictive, and it should be appreciated that variations may be made in those embodiments by workers skilled in the art without departing from the scope as defined by the following claims.

What is claimed is:

1. A method, comprising:
    forming a first protective layer on a servo zone of a substrate;
    patterning features on a data zone of the substrate,
        wherein patterning the features on the data zone comprises
            forming a data zone pattern by directed self-assembly of block copolymers, and
            transferring the data zone pattern to the substrate, and
        wherein the first protective layer protects the servo zone while forming and transferring the data zone pattern;
    forming a second protective layer on the data zone;
    removing the first protective layer from the servo zone;
    patterning features on the servo zone; and
    removing the second protective layer from the data zone.

2. The method of claim 1, further comprising
    using alignment schemes and alignment mark settings in overlay processes for alternately depositing the protective layers and patterning the features on the servo and data zones, respectively.

3. The method of claim 1,
    wherein the features on the data zone correspond to an areal density of at least 1.5 Tbpsi in a bit-patterned recording medium.

4. The method of claim 1,
    wherein forming the first and second protective layers comprises respectively forming first and second resist layers by optical lithography selected from I-line lithography, DUV lithography, and EUV lithography.

5. The method of claim 4,
    wherein forming the first protective layer further comprises removing the first resist layer to expose the first protective layer, and
    wherein the first protective layer comprises chromium.

6. The method of claim 5,
    wherein the second protective layer comprises the first resist layer.

7. The method of claim 5,
    wherein the second protective layer comprises a chromium layer underlying the first resist layer.

8. The method of claim 1,
wherein patterning the features on the servo zone comprises
   forming a servo zone pattern by directed self-assembly of block copolymers, and
   transferring the servo zone pattern to the substrate, and
wherein the second protective layer protects the data zone while forming and transferring the servo zone pattern.

9. The method of claim 8,
wherein transferring the data and servo zone patterns to the substrate comprises reactive ion etching (RIE) with $CF_4$ to pattern the features into the substrate.

10. The method of claim 1, further comprising
forming a chromium layer over a quartz substrate before forming the first protective layer on the servo zone of the substrate.

11. A method, comprising:
forming a servo zone with one-dimensional features; and
forming a data zone with two-dimensional features,
   wherein forming the data zone comprises transferring a data zone pattern formed by directed self-assembly of block copolymers to a substrate,
   wherein a first protective layer protects the servo zone while forming and transferring the data zone pattern, and
   wherein the two-dimensional features of the data zone are integrated on the same substrate with the one-dimensional features of the servo zone.

12. The method of claim 11,
wherein forming the servo zone comprises transferring a servo zone pattern formed by directed self-assembly of block copolymers to the substrate, and
wherein a second protective layer protects the data zone while forming and transferring the servo zone pattern.

13. The method of claim 12,
wherein the one-dimensional features comprise lines.

14. The method of claim 13,
wherein the two-dimensional features comprise hexagonal dots.

15. The method of claim 11,
wherein the directed self-assembly is configured to amplify the areal density of the data zone.

16. The method of claim 11, further comprising
forming the data zone pattern by directed self-assembly of block copolymers over an imprinted resist layer of the data zone, and
wherein the first protective layer comprises chromium.

17. The method of claim 12, further comprising
forming the servo zone pattern by directed self-assembly of block copolymers comprises over an imprinted resist layer of the servo zone, and
wherein the second protective layer comprises a non-imprinted resist layer.

18. A method, comprising:
patterning a first set of features in a data zone,
   wherein patterning the first set of features in the data zone comprises transferring a data zone pattern formed by directed self-assembly of block copolymers to a substrate, and
   wherein a first protective layer protects the servo zone while forming and transferring the data zone pattern; and
patterning a second set of features in the servo zone,
   wherein patterning the second set of features in the servo zone comprises transferring a servo zone pattern formed by directed self-assembly of block copolymers to the substrate, and
   wherein a second protective layer protects the data zone while forming and transferring the servo zone pattern.

19. The method of claim 18, further comprising
forming the data zone pattern by directed self-assembly of block copolymers over an imprinted resist layer of the data zone, and
forming the servo zone pattern by directed self-assembly of block copolymers over an imprinted resist layer of the servo zone.

20. The method of claim 18,
wherein the first protective layer comprises chromium, and
wherein the second protective layer comprises a resist layer over a chromium layer.

* * * * *